United States Patent
Park

(10) Patent No.: US 11,081,149 B1
(45) Date of Patent: Aug. 3, 2021

(54) MEMORY DEVICE FOR ARTIFICIAL INTELLIGENCE OPERATION

(71) Applicant: Winbond Electronics Corp., Taichung (TW)

(72) Inventor: San-Ha Park, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/836,906

(22) Filed: Mar. 31, 2020

(51) Int. Cl.
| | |
|---|---|
| G11C 7/02 | (2006.01) |
| G11C 7/06 | (2006.01) |
| G11C 8/08 | (2006.01) |
| G11C 8/10 | (2006.01) |
| G11C 7/12 | (2006.01) |
| G06N 5/02 | (2006.01) |

(52) U.S. Cl.
CPC ............... *G11C 7/065* (2013.01); *G11C 7/12* (2013.01); *G11C 8/08* (2013.01); *G11C 8/10* (2013.01); *G06N 5/02* (2013.01)

(58) Field of Classification Search
CPC .. G11C 7/065; G11C 7/12; G11C 8/08; G11C 8/10
USPC ......................................................... 365/207
See application file for complete search history.

(56) References Cited

U.S. PATENT DOCUMENTS

| | | | |
|---|---|---|---|
| 9,589,602 B2 | 3/2017 | Tiwari | |
| 9,601,183 B1* | 3/2017 | Kajigaya | G11C 11/4076 365/230.06 |
| 2009/0034315 A1* | 2/2009 | Yu et al. | 365/51 |
| 2018/0158494 A1* | 7/2018 | Park | G11C 7/1027 |

FOREIGN PATENT DOCUMENTS

| | | |
|---|---|---|
| CN | 108022615 | 5/2018 |
| TW | 201937490 | 9/2019 |

OTHER PUBLICATIONS

Hyunsung Shin et al., "McDRAM: Low Latency and Energy-Efficient Matrix Computations in DRAM," IEEE Transactions on Computer-Aided Design of Integrated Circuits and Systems, vol. 37, No. 11, Nov. 2018, pp. 2613-2622.
"Office Action of Korea Counterpart Application" with English translation thereof, dated Mar. 29, 2021, p. 1-p. 7.

* cited by examiner

*Primary Examiner* — Vu A Le
(74) *Attorney, Agent, or Firm* — JCIPRNET

(57) ABSTRACT

A memory device is provided. The memory device includes: a plurality of subarrays, a row controller, a column controller, a plurality of sense amplifiers, a plurality of sub word line drivers, and a plurality of logic circuits. Each of the subarrays are electrically coupled to each other. The row controller is configured to control at least a row of the subarrays. The column controller is configured to control at least one column of the subarrays. The sense amplifiers adapted to each of the subarrays are enabled during a data access operation. The sub word line drivers are disposed adjacent to each of the subarrays and provides a driving signal corresponds to the subarrays. The plurality of logic circuits is disposed in the subarrays and configured to perform the data access operation.

9 Claims, 3 Drawing Sheets

MEMORY DEVICE FOR ARTIFICIAL INTELLIGENCE OPERATION

BACKGROUND OF THE INVENTION

Technical Field

The present disclosure relates to a memory device, and more relates to a function in memory device (FIM).

Description of Related Art

Nowadays, in the field artificial intelligence AI, machine learning applications, a memory device is widely used. For those applications, a data movement between a controller and the memory device will induce slow and high-power consumption due to the data may access through a wiring or a substrate (RDL), therefore bandwidth is limited by the number of wiring and drawing in the substrate (RDL). The data movement between the controller and the memory device is performed by computing the data stored in the memory device and store the data as an intermediate data. The data movement cause significant overhead in the bandwidth of the memory device results in degrading the performance of the memory device.

For an example, referring to FIG. 1 illustrating a block diagram of a conventional memory device. The conventional memory device 100 includes a plurality of memory cells 110. Each of the memory cells 110 are sub-divided into plurality of subarrays 150. Each of the memory cells 110 further includes a row address decoder 120, a column address decoder 130, a plurality of sub word line drivers (SWD) 151, a plurality of sense amplifiers (SA) 152, and a logic circuit 170, is also known as a MAC.

The subarrays 150 are coupled to the corresponding sub word drivers 151 and the sense amplifiers 152.

During a data access operation, is also known as a data movement operation is configured to access the data in the memory device. The data access operation is performed by accessing data from each of the subarrays 150 by the corresponding sense amplifiers 152 through a plurality local data lines LDQ from each of the sense amplifiers 152. During data accessing from the subarrays 150 arranged in each column are accessed through a plurality of main data lines MDQ, is also known as global I/O GIO. It is noted that, a plurality of switches 156 are disposed between each of the sense amplifiers 152. The switches 156 transfers the data between the main data lines MDQ and the local data lines LDQ during data the data access operation.

In one example, for the memory cells 110 with 72 subarrays arranged in 9×8, that is 9 rows and 8 columns of the subarrays 150.

During the data access operation, 9 bits of data from each of the columns are accessed through the main data lines MDQ through the local data lines LDQ corresponding to each of the sense amplifiers 152 and the data from the memory cells 110 are logically calculated by the logic circuit 170 disposed outside the memory cells 110. To be specific, to access all the subarrays in the memory cells 110, the main data lines MDQ are used to access the data during the data access operation. In other words, 8 main data lines MDQ corresponding to 8 columns in the subarrays 150 are used to access the 72-bit data in the memory cells 110. It is noted that, the local data line LDQ is shorter than the main data lines MDQ. During the data access operation each 9-bit data are accessed through long main data lines MDQ results in the increasing the power consumption and increasing the overhead in bandwidth of the memory device. In addition, a data line amplifier is adapted to each of the main data lines MDQ to access the data through the long data line.

Along with requirement of overcoming the overhead in bandwidth of the memory device and the increasing power consumption, it could be desirable to develop a function in memory device that provides wide data bandwidth and less power consumption for certain applications in this technical field.

SUMMARY OF THE INVENTION

The memory device of the disclosure includes a plurality of subarrays, a row controller, a column controller, a plurality of sense amplifiers, a plurality of sub word line drivers, and a plurality of logic circuits. Each of the subarrays are electrically coupled to each other. The row controller is configured to control at least one row of the subarrays. The column controller is configured to control at least one column of the subarrays. The sense amplifiers are adapted to each of the subarrays are enabled during a data access operation. The sub word line drivers are disposed adjacent to each of the subarrays and provides a driving signal corresponds to the subarrays. The plurality of logic circuits is disposed in the subarrays and configured to perform the data access operation.

Based on the above, in the embodiments of the disclosure, the more bits from the subarrays may be calculated at the same time by adopting the plurality of logic circuits in the subarrays, thereby performing a function in memory device. In addition, by using a local data lines LDQ to access the data during the data accessing operation instead of main data lines MDQ, thereby reducing the power consumption of the memory device during the data access operation. Furthermore, a data line amplifier is avoided by using local data lines LDQ instead of main data lines MDQ during the data accessing operation, therefore the power consumption is further reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
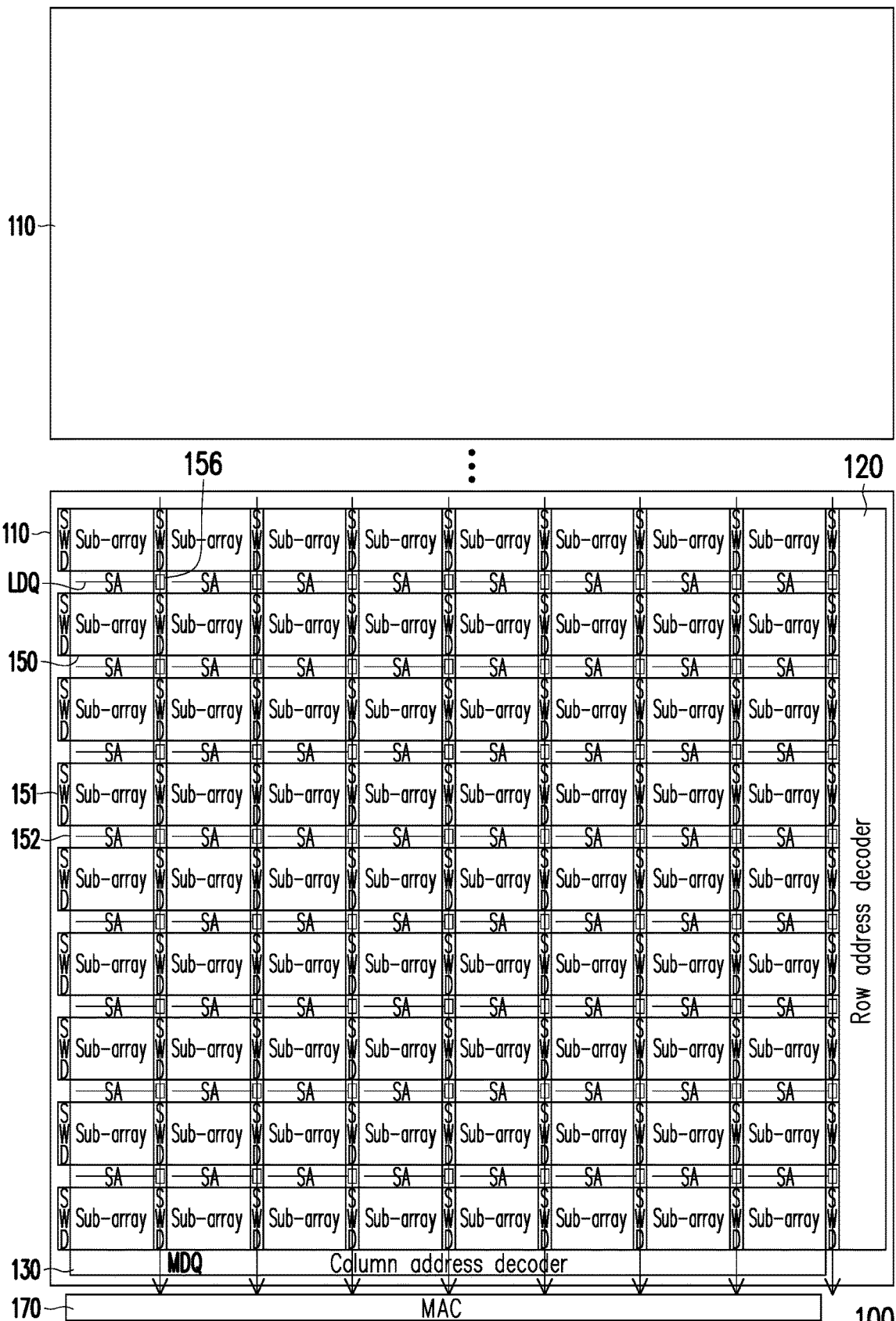
FIG. 1 illustrates a block diagram of a conventional memory device.
Figure 2:
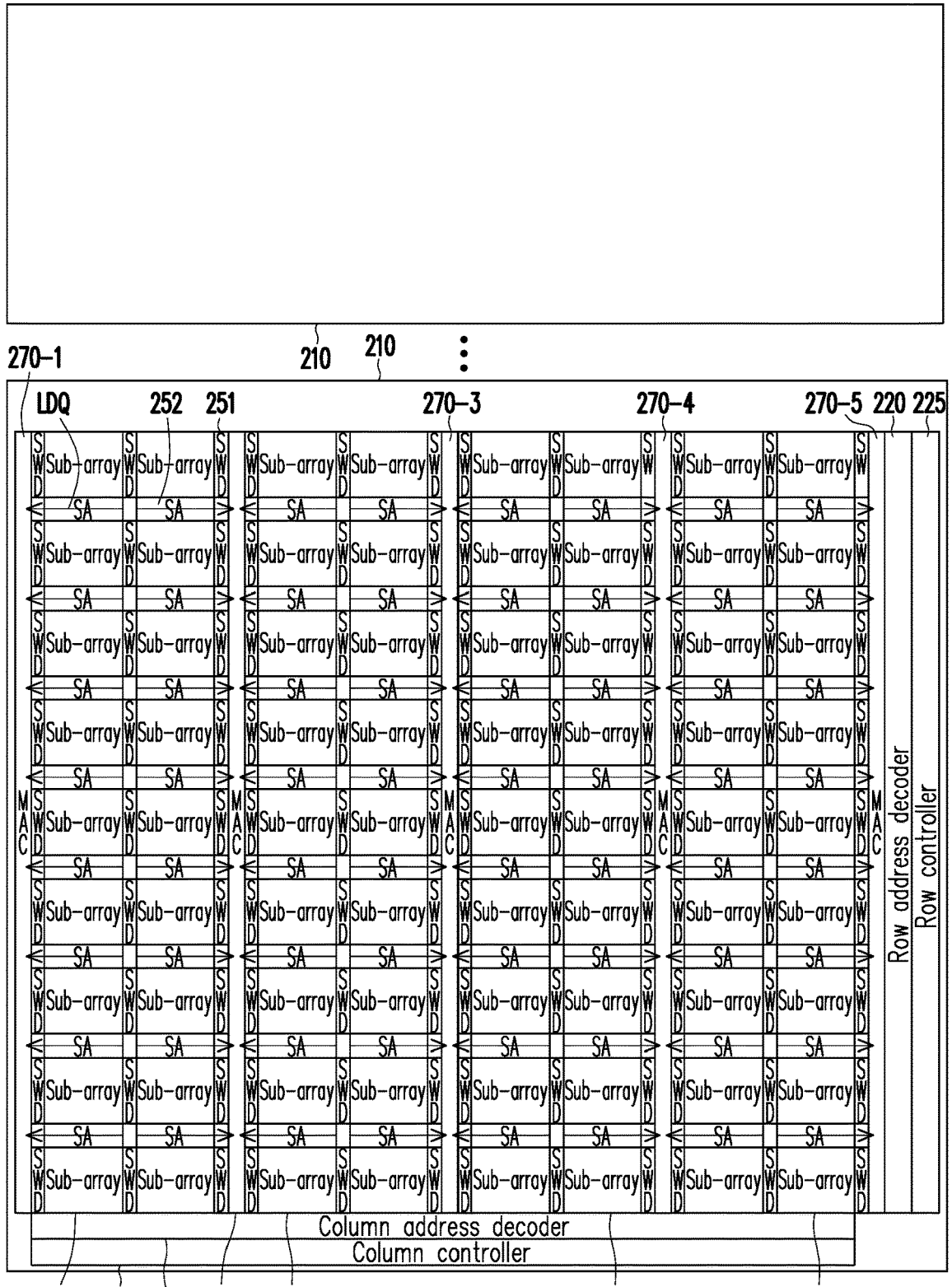
FIG. 2 illustrates a block diagram of a memory device according to an exemplary embodiment of the disclosure.

FIG. 2 illustrates a block diagram of a memory device according to an exemplary embodiment of the disclosure. Referring to FIG. 2, the memory device 200 includes a plurality of memory cells 210. Each of the memory cells 210 are sub-divided into a plurality of subarrays 250. The number of subarrays 250 in each of the memory cells 210 are determined according to the density of the memory device 200.

The memory device 200 may be a volatile memory device and/or a non-volatile memory device, thus a type of the memory device 200 is not limited in this disclosure. The memory device 200 includes multiple memory cells, typically 8 to 72 subarrays in each memory cells.

Each of the memory cells 210 further includes a row address decoder 220, a row controller 225, a column address decoder 230, a column controller 235, a plurality of sub word line drivers (SWD) 251, a plurality of sense amplifiers (SA) 252, and a plurality of logic circuits 270.

The subarrays 250 are coupled to a plurality of sub word line drivers 251 and the sense amplifiers 252. In other words, each of the subarrays includes at least one sub word line driver 251 and the one sense amplifier 252. The sub word line drivers 251 are arranged adjacent to both sides of the subarrays 250, and are configured to provide a driving signal corresponding to the subarrays 250. The subarrays 250 which are internally connected by internal data bus. The data movement and/or a data accessing operation between the subarrays 250 are performed by the internal data bus.

The subarrays 250 is divided into a first part subarrays 250-1, a second part subarrays 250-2, a third part subarrays 250-3, and a fourth part subarrays 250-4. It is noted that the first part subarrays 250-1, the second part 250-2, the third part subarrays 250-3, and the fourth part subarrays 250-4 are arranged in sequence.

The row controller 225 and the column controller 235 may receive a control signal from an address register (not shown) to access the data corresponding to the subarrays 250. The row controller 225 is configured to control a row of the subarrays 250. Similarly, the column controller 235 is configured to control a column of the subarrays 250. The access data in this disclosure refers to a read operation, a write operation, and/or a backup operation. Thus, a function of access data in this disclosure is not limited. Based on the control signal from the address register to access the data, the row controller 225 provides a row control signal to the row address decoder 220. On the other hand, the column controller 235 provides a column control signal to the column address decoder 230.

The row address decoder 220 associates with each of the memory cells 210 are configured to select at least one row of the memory cells 210. Similarly, the column address decoder 230 associates with each of the memory cells 210 configured to select at least one column of the memory cells 210.

The sense amplifiers 252 are adapted to each of the subarrays 250. The sense amplifiers 252 are enabled/disabled during the data accessing operation in the subarrays 250.

The plurality of logic circuits, also known as MACs 270 are disposed in the subarrays 250. The logic circuits 270 are configured to perform the data access operation. To be specific, one logic circuit is disposed between each pairs of the subarrays 250 in the column direction and one logic circuit is disposed on the either side on edge of the subarrays 250 in the column direction. In other words, by this arrangement at least one logic circuit 270 is disposed adjacent to each of the subarrays 250 in the column direction.

The logic circuits 270 includes a first logic circuit 270-1, a second logic circuit 270-2, a third logic circuit 270-3, a fourth logic circuit 270-4, and a fifth logic circuit 270-5. The first logic circuit 270-1 is disposed adjacent to the first part subarrays 250-1 in the column direction. The second logic circuit 270-2 is disposed between the first part subarrays 250-1 and the second part subarrays 250-2 in the column direction. The third logic circuit 270-3 is disposed between the second part subarrays 250-2 and the third part subarrays 250-3 in the column direction. The fourth logic circuit 270-4 is disposed between the third part subarrays 250-3 and the fourth part subarrays 250-4 in the column direction. The fifth logic circuit 270-5 is disposed adjacent to the fourth part subarrays 250-4 in the column direction.

It is noted that, when number parts in the subarrays 250 is n, then the number of logic circuits 270 in the memory device 200 is n+1, where n is a positive integer.

The data access operation in the subarrays 250 are performed by the logic circuits 270 by logically calculating the data stored in the subarrays 250. In other words, by disposing logic circuits 270 inside the subarrays 250 to perform logical calculation is also known as function in the memory device 200.

The data access operation includes a read operation, a write operation, a read and calculate operation, a read and write back operation, a read and write to another address operation in the memory device 200.

It is noted that, at least one logic circuit among the plurality of logic circuits 270 is disposed adjacent to each of the subarrays 250. In other words, the data access operation in each of the subarrays 250 are performed by the at least one logic circuit among the plurality of logic circuits 270 is disposed adjacent to each of the subarrays 250 in the column direction. To be specific, at least one logic circuit 270 is disposed between the pair of subarrays 250 and at least one logic circuit 270 is disposed on the either side of the subarrays 250 in the column direction. In other words, the data from the subarrays 250 are directly accessed by the corresponding sense amplifiers 252 through a plurality of local data lines LDQ from each of the sense amplifiers 252.

In one example, for the memory cells 110 with 72 subarrays arranged in 9×8, that is 9 rows and 8 columns of the subarrays 250.

In some embodiments, the number of rows (M) and the number of columns (N) in the memory cells 110 are represented as M*N, where M and N are positive integer values. The value of the M and N are determined according to the number of subarrays 250 in the memory cells 110.

During the data access operation, the 4-bit data from each of the subarrays 250 are accessed by the corresponding sense amplifiers 252 through the local data lines LDQ and the logic circuits 270 performs logical calculation of the data in the memory cells 210.

Based on the above, during the data access operation by using the local data lines LDQ to access the subarrays by the logic circuits, the power consumption is less compared with the data access operation in the subarrays through the main data lines MDQ. By using the local data lines LDQ directly to access the data by the logic circuits, more data may be calculated at the same time during the data access operation. In addition, a data line amplifier is avoided by using local data lines LDQ instead of main data lines MDQ during the data accessing operation, therefore the power consumption of the memory device is further reduced.

Figure 3:
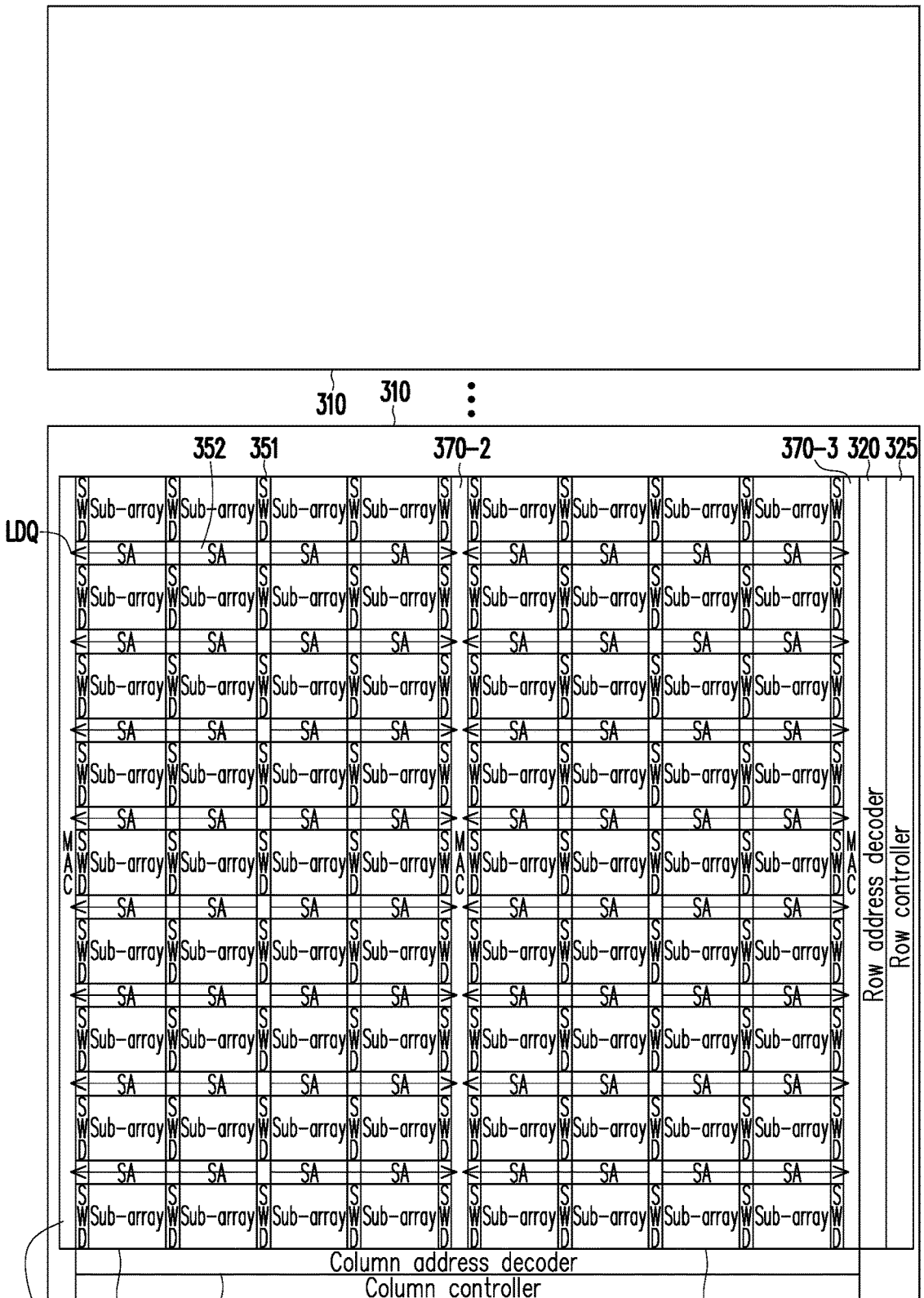
FIG. 3 illustrates a block diagram of a memory device according to an exemplary embodiment of the disclosure.

FIG. 3 illustrates a block diagram of a memory device according to an exemplary embodiment of the disclosure. The memory device 300 includes a plurality of memory cells 310. Each of the memory cells 310 are sub-divided into a plurality of subarrays 350. The number of subarrays 350 in each of the memory cells 310 are determined according to the density of the memory device 300.

Each of the memory cells 310 further includes a row address decoder 320, a row controller 325, a column address decoder 330, a column controller 335, a plurality of sub line word drivers (SWD) 351, a plurality of sense amplifiers (SA) 352, and a plurality of logic circuits 370.

It is noted that the memory cells 310 is respectively similar to a plurality of memory cells 210 with reference to FIG. 2, thus the detailed description of the memory cells 310 in the memory device 300 is omitted herein.

The sense amplifiers 352 are adapted to each of the subarrays 350. The sense amplifiers 352 are enabled/disabled during the data accessing operation in the subarrays 350.

The subarrays 350 is divided into a first part subarrays 350-1 and a second part subarrays 350-2. It is noted that the first part subarrays 350-1 and the second part subarrays 350-2 are arranged in sequence. The plurality of logic circuits 370, is also known as MACs are disposed in the subarrays 350. The logic circuits 370 are configured to perform the data access operation. To be specific, one logic circuit among the plurality of logic circuits 370 is disposed in the middle of the subarrays 350 and one logic circuit among the plurality of logic circuits 370 is disposed on either side on edge of the subarrays 350 in the column direction.

The logic circuits 370 includes a first logic circuit 370-1, a second logic circuit 370-2, and a third logic circuit 370-3. The first logic circuit 370-1 is disposed adjacent to the first part subarrays 350-1 in the column direction. The second logic circuit 370-2 is disposed between the first part subarrays 350-1 and the second part subarrays 350-2 in the column direction. The third logic circuit 370-3 is disposed adjacent to the second part subarrays 350-2 in the column direction.

It is noted that, when number of parts in the subarrays 350 is n, then the number of logic circuits 370 in the memory device 300 is n+1, where n is a positive integer.

The data access operation in the subarrays 350 are performed by the logic circuits 370 by logically calculating the data stored in the subarrays 350. In other words, by disposing logic circuits 370 inside the subarrays 350 to perform logical calculation is also known as function in the memory device 300.

The data access operation in each of the subarrays 350 are performed by the at least one logic circuit 370 is disposed in the middle of the subarrays 350 and at least one logic circuit is disposed on the either side of the subarrays 350 in the column direction.

The data access operation includes a read operation, a write operation, a read and calculate operation, a read and write back operation, a read and write to another address operation in the memory device 300.

In detail, the data from the subarrays 350 are directly accessed by the corresponding sense amplifiers 352 through a plurality of local data lines LDQ from each of the sense amplifiers 352.

In one example, for the memory cells 110 with 72 subarrays arranged in 9×8, that is 9 rows and 8 columns of the subarrays 350. During the data access operation, the 8-bit data from each pair of the subarrays 350, that is 4-bit data from each of the subarrays 350 are accessed by the corresponding sense amplifier 352 through the local data lines LDQ and the logic circuits 370 performs logical calculation of the data in the memory cells 310.

Based on the above, during the data access operation by using the local data lines LDQ to access the subarrays by the logic circuits, the power consumption is less compared with the data access operation in the subarrays through the main data lines MDQ. By using the local data lines LDQ directly to access the data by the logic circuits, more data may be calculated at the same time during the data access operation. In addition, a data line amplifier is avoided by using local data lines LDQ instead of main data lines MDQ during the data accessing operation, therefore the power consumption of the memory device is further reduced. By this arrangement of disposing the logic circuits 370 in the middle of the subarrays 350, a smaller number of local data lines LDQ are used compared with disposing at least one logic circuit 370 adjacent to each of the subarrays 350 in the column direction, thereby reducing the power consumption is reduced further. In other words, the power consumption is reduced to 50% compared with disposing at least one logic circuit 370 adjacent to each of the subarrays 350. Furthermore, by this arrangement of disposing the logic circuit in the middle of the subarrays, smaller number of local data lines LDQ are used compared with disposing at least one logic circuits adjacent to each of the subarrays in the column direction further reduces the power consumption of the memory device.

In summary, in the embodiments of the disclosure the data accessing operation in the memory cells is performed by using the plurality of logic circuits through the local data lines LDQs disposed in the subarrays more data may be accessed at the same time. In addition, the local data lines LDQ is short, the power consumption during the data access operation is reduced. Furthermore, by avoiding the main data lines MDQ to access the data in the subarrays, a data line amplifier is not needed to amplify the long main data lines MDQ during the data access operation in the memory device, which further reduces the power consumption in the memory device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
    a plurality of subarrays, wherein each of the subarrays are electrically coupled to each other;
    a row controller, configured to control at least one row of the subarrays;
    a column controller, configured to control at least one column of the subarrays;
    a plurality of sense amplifiers, adapted to each of the subarrays are enabled during a data access operation;
    a plurality of sub word line drivers, disposed adjacent to each of the subarrays and provides a driving signal corresponds to the subarrays; and
    a plurality of logic circuits, wherein each one of the logic circuits is disposed between each pairs of the subarrays in column direction and disposed on one side on an edge of the subarrays in the column direction, configured to perform the data access operation.

2. The memory device of claim 1, wherein the subarrays are divided into a first part subarrays, a second part subarrays, a third part subarrays, and a fourth part subarrays,
    the first part subarrays, the second part subarrays, the third part subarrays, and the fourth part subarrays are arranged in sequence.

3. The memory device of claim 2, the logic circuits comprise a first logic circuit, a second logic circuit, a third logic circuit, a fourth logic circuit, and a fifth logic circuit,
    the first logic circuit is disposed adjacent to the first part subarrays in a column direction, the second logic circuit is disposed in between the first part subarrays and the second part subarrays in the column direction, the third logic circuit is disposed between the second part subarrays and the third part subarrays in the column direction, the fourth logic circuit is disposed between the third part subarrays and the fourth part subarrays in the column direction, the fifth logic circuit is disposed adjacent to the fourth part subarrays in the column direction.

4. The memory device of claim 1, wherein the subarrays are divided into a first part subarrays and a second part subarrays,
the first part subarrays and the second part subarrays are arranged in sequence.

5. The memory device of claim 4, the logic circuits comprise a first logic circuit, a second logic circuit, and a third logic circuit,
the first logic circuit is disposed adjacent to the first part subarrays in a column direction, the second logic circuit is disposed between the first logic circuit and the second logic circuit in the column direction, and the third logic circuit is disposed adjacent to the second part subarrays in the column direction.

6. The memory device of claim 1, wherein the data access operation in the subarrays is performed by logically calculating the data stored in the subarrays by the logic circuits disposed adjacent to the subarrays.

7. The memory device of claim 1, further comprising:
a plurality of local data lines, configured to perform the data access operation from each of the subarrays and transfer the data to the plurality of logic circuits disposed in the subarrays.

8. The memory device of claim 1, wherein the data access operation is a read operation, or a write operation, or a read and calculate operation, or a read and write back operation, or read and write to another address in the memory device.

9. The memory device of claim 1, the logic circuits is a MAC.

* * * * *